(12) United States Patent
Shieh et al.

(10) Patent No.: US 8,730,473 B2
(45) Date of Patent: May 20, 2014

(54) MULTIPLE EDGE ENABLED PATTERNING

(75) Inventors: Ming-Feng Shieh, Yongkang (TW); Ya Hui Chang, Hsinchu (TW); Ru-Gun Liu, Hsinchu (TW); Tsong-Hua Ou, Taipei (TW); Ken-Hsien Hsieh, Taipei (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 208 days.

(21) Appl. No.: 12/892,403

(22) Filed: Sep. 28, 2010

(65) Prior Publication Data

US 2012/0074400 A1 Mar. 29, 2012

(51) Int. Cl.
  *G01B 11/00* (2006.01)
  *H01L 21/76* (2006.01)
  *H01L 23/58* (2006.01)

(52) U.S. Cl.
  USPC .......................... 356/401; 257/797; 438/401

(58) Field of Classification Search
  None
  See application file for complete search history.

(56) References Cited

U.S. PATENT DOCUMENTS

| | | | | |
|---|---|---|---|---|
| 5,601,957 A | * | 2/1997 | Mizutani et al. | 430/22 |
| 5,982,044 A | * | 11/1999 | Lin et al. | 257/797 |
| 6,063,529 A | * | 5/2000 | Hwang | 430/22 |
| 6,110,021 A | * | 8/2000 | Ota et al. | 451/159 |
| 6,300,018 B1 | * | 10/2001 | Dilley et al. | 430/5 |
| 6,521,900 B1 | * | 2/2003 | Hirayanagi | 250/491.1 |
| 6,730,444 B2 | * | 5/2004 | Bowes | 430/5 |
| 6,841,315 B2 | * | 1/2005 | Imura | 430/5 |
| 6,937,337 B2 | * | 8/2005 | Ausschnitt et al. | 356/401 |
| 8,004,678 B2 | * | 8/2011 | Weiss et al. | 356/399 |
| 8,148,232 B2 | * | 4/2012 | Chen et al. | 438/401 |
| 2005/0128452 A1 | * | 6/2005 | Matsumoto | 355/55 |
| 2006/0234165 A1 | * | 10/2006 | Kamigaki et al. | 430/313 |
| 2008/0002213 A1 | * | 1/2008 | Weiss | 356/620 |
| 2009/0096116 A1 | * | 4/2009 | Yang | 257/797 |
| 2009/0110878 A1 | * | 4/2009 | Pratt et al. | 428/137 |
| 2009/0134531 A1 | * | 5/2009 | Yang | 257/797 |
| 2009/0225331 A1 | * | 9/2009 | Van Haren | 356/614 |
| 2010/0203734 A1 | | 8/2010 | Shieh et al. | |
| 2011/0287630 A1 | * | 11/2011 | Brown et al. | 438/689 |

FOREIGN PATENT DOCUMENTS

JP 2004273612 A * 9/2004

* cited by examiner

*Primary Examiner* — Gordon Stock, Jr.
(74) *Attorney, Agent, or Firm* — Haynes and Boone, LLP

(57) ABSTRACT

Provided is an alignment mark having a plurality of sub-resolution elements. The sub-resolution elements each have a dimension that is less than a minimum resolution that can be detected by an alignment signal used in an alignment process. Also provided is a semiconductor wafer having first, second, and third patterns formed thereon. The first and second patterns extend in a first direction, and the third pattern extend in a second direction perpendicular to the first direction. The second pattern is separated from the first pattern by a first distance measured in the second direction. The third pattern is separated from the first pattern by a second distance measured in the first direction. The third pattern is separated from the second pattern by a third distance measured in the first direction. The first distance is approximately equal to the third distance. The second distance is less than twice the first distance.

20 Claims, 14 Drawing Sheets

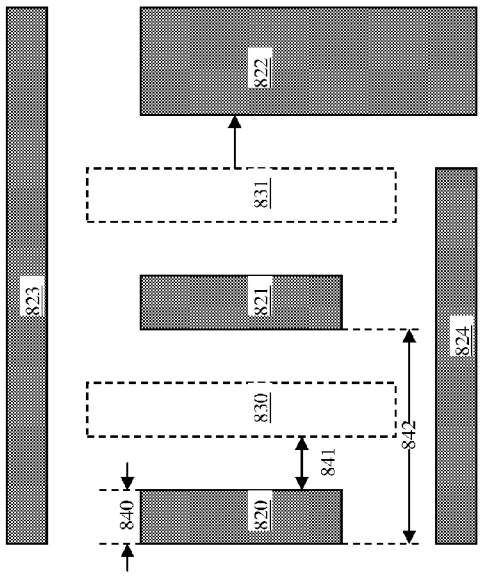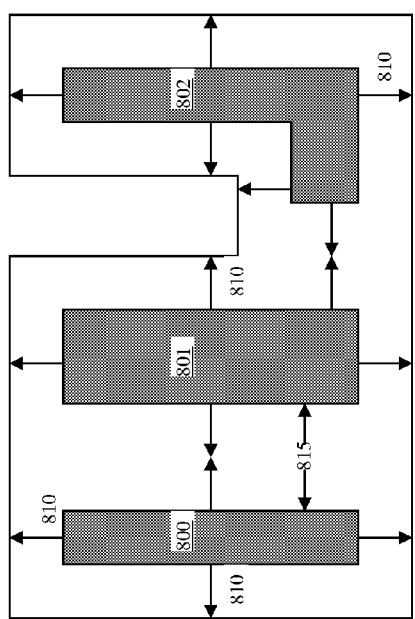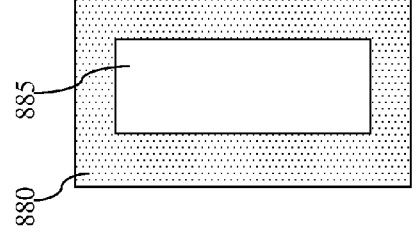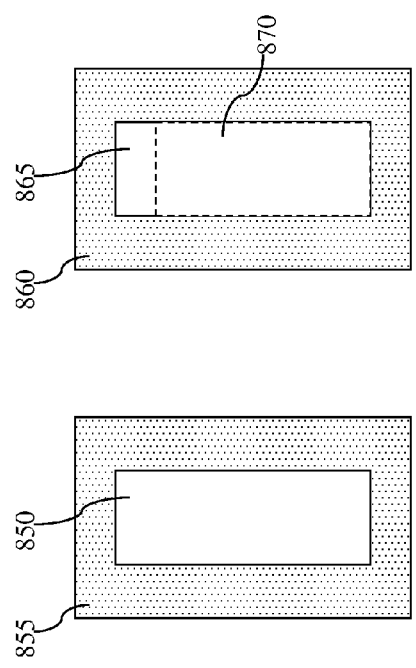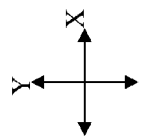

MULTIPLE EDGE ENABLED PATTERNING

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

To achieve small geometry sizes and small pitch sizes, traditional semiconductor fabrication processes have used multiple photomasks to pattern a wafer. The use of multiple photomasks increases fabrication costs and prolongs fabrication time. In addition, alignment and overlay errors may become a greater concern, particularly as geometry sizes continue to shrink. Moreover, it may be difficult to form both a relatively large pattern and a relatively small pattern on a wafer at the same time. The large pattern may "disappear" or lose its shape under some existing fabrication techniques.

Therefore, while existing semiconductor fabrication methods to achieve small geometry sizes and small pitch sizes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 14A-14E are diagrammatic fragmentary top level views of a portion of a design layout that help illustrate certain design rules according to various aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
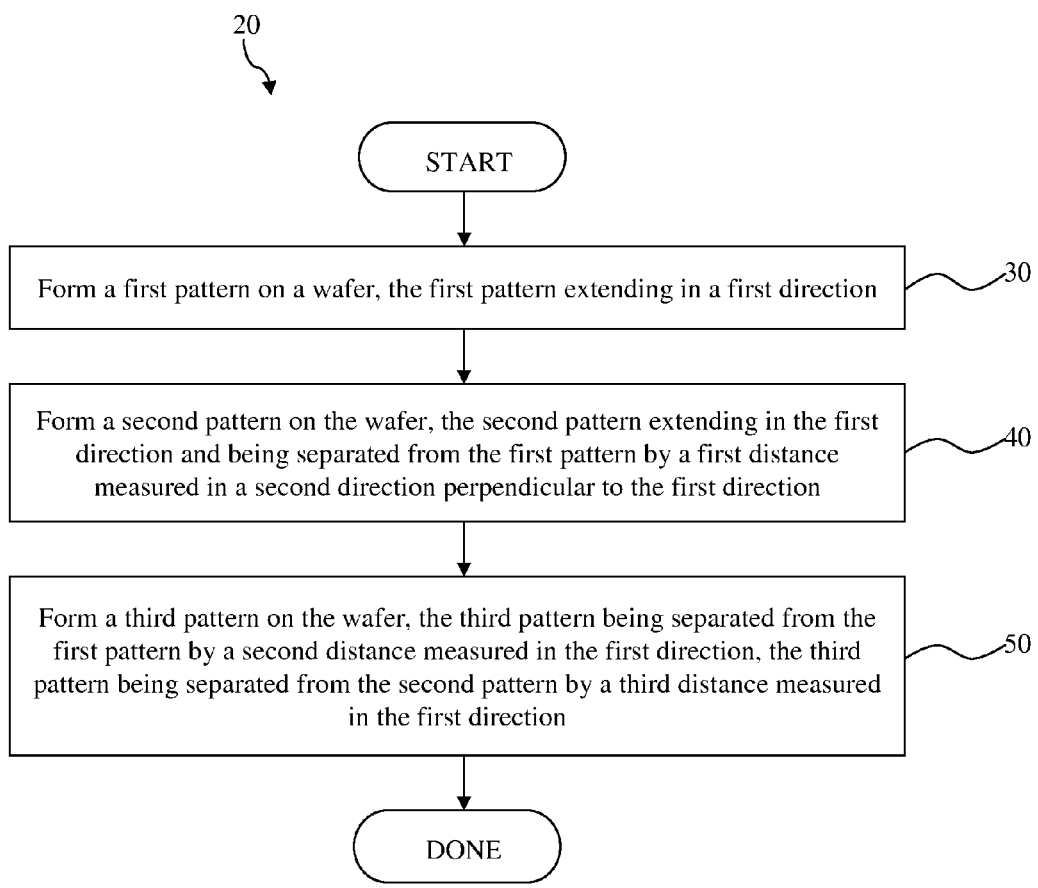
FIG. 1 is a flowchart illustrating a method for patterning a semiconductor device according to various aspects of the present disclosure.

Illustrated in FIG. 1 is a flowchart of a method 20 for patterning a semiconductor device. The method 20 begins with block 30 in which a first pattern is formed on a wafer. The first pattern extends in a first direction. The method 20 continues with block 40 in which a second pattern is formed on the wafer. The second pattern extends in the first direction and is separated from the first pattern by a first distance measured in a second direction perpendicular to the first direction. The method 20 continues with block 50 in which a third pattern is formed on the wafer. The third pattern is separated from the first pattern by a second distance measured in the first direction. The third pattern is separated from the second pattern by a third distance measured in the first direction. The first distance is approximately equal to the third distance. The second distance is less than twice the first distance.

Figure 2:
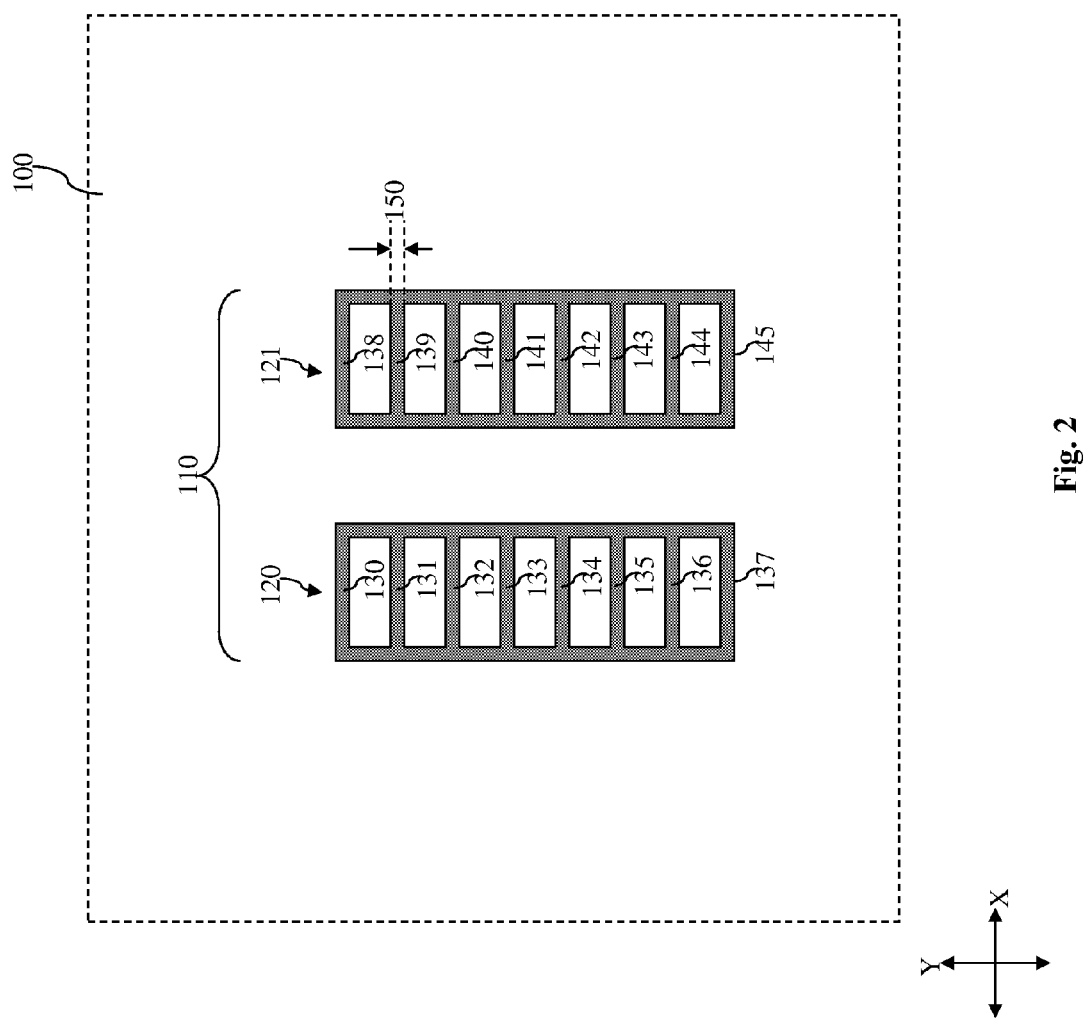
FIG. 2 is a diagrammatic fragmentary top level view of a portion of a photomask containing an alignment mark according to various aspects of the present disclosure.

FIG. 2 is a diagrammatic fragmentary top view of a portion of a photomask 100. The photomask. The photomask 100 is operable to project a plurality of patterns or images (not illustrated in FIG. 2) to a semiconductor wafer in a photolithography process. The patterns correspond to different portions of one or more semiconductor devices. The semiconductor device(s) may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

In the embodiment illustrated in FIG. 2, the photomask 100 includes an alignment mark 110. The alignment mark 110 has two portions 120 and 121 that are spaced apart from one another. An outer profile of each of the portions 120-121 of the alignment mark 110 substantially resembles an elongated rectangle that extends in an X-direction.

A plurality of bars (or segments) 130-145 divide (in the X-direction) each of the portions 120-121 into a plurality of smaller rectangular "boxes". Each of the bars has a dimension 150 measured in a Y-direction that is perpendicular to the X-direction. It is understood that the X-direction may be a horizontal direction, and the Y-direction may be a vertical direction. Alternatively, the X-direction may be a vertical direction, and the Y-direction may be a horizontal direction. It is also understood that the number of bars 130-145 is arbitrary, and that an alternative number of bars may be disposed within (and divide) the portions 120-121 of the alignment mark 110 in alternative embodiments.

The dimension 150 is relatively small. The dimension 150 has a value such that patterns formed on the wafer corresponding to the bars 130-145 cannot be individually recognized or detected by an alignment signal used in an alignment process. Alternatively stated, the patterns on the wafer corresponding to the bars 130-145 will be sub-resolution patterns or sub-resolution elements, because they each have a dimension that is less than the minimum resolution that can be detected by the alignment signal. This will be discussed in more detail later. The patterns on the photomask 100 are much larger than the corresponding patterns formed on the wafer, but their dimensions are directly correlated. Therefore, the dimension 150 is X times the minimum resolution that can be detected by the alignment signal. X measures a shrinkage in size as image of the patterns (such as the alignment mark 110) on the photomask 100 are transferred to a wafer.

In an embodiment, the dimension 150 is associated with a critical dimension (CD) of a particular semiconductor fabrication technology generation/node. The critical dimension represents the smallest feature size that can be formed on a substrate in the given semiconductor fabrication technology generation. For example, in a 22-nm fabrication technology generation, the critical dimension is 22 nm, meaning that the smallest semiconductor feature that the 22-nm technology generation can form is approximately 22 nm. It is understood, however, that the actual value of the dimension 150 may be larger than the value of the critical dimension, since the dimension 150 represents the critical dimension with respect to the photomask 100, which is shrunk when it is patterned onto a semiconductor wafer. For instance, the dimension 150 on the photomask 100 may be approximately X times the value of the critical dimension of patterns formed on the wafer.

Under existing semiconductor fabrication techniques, oftentimes a large pattern will "disappear" when it is formed along with small patterns at the same time. Here, the alignment mark 110 is designed to have the shape and geometry as illustrated in FIG. 2 to solve the problem of "disappearing large patterns". This will also be discussed in more detail later.

Figure 3:
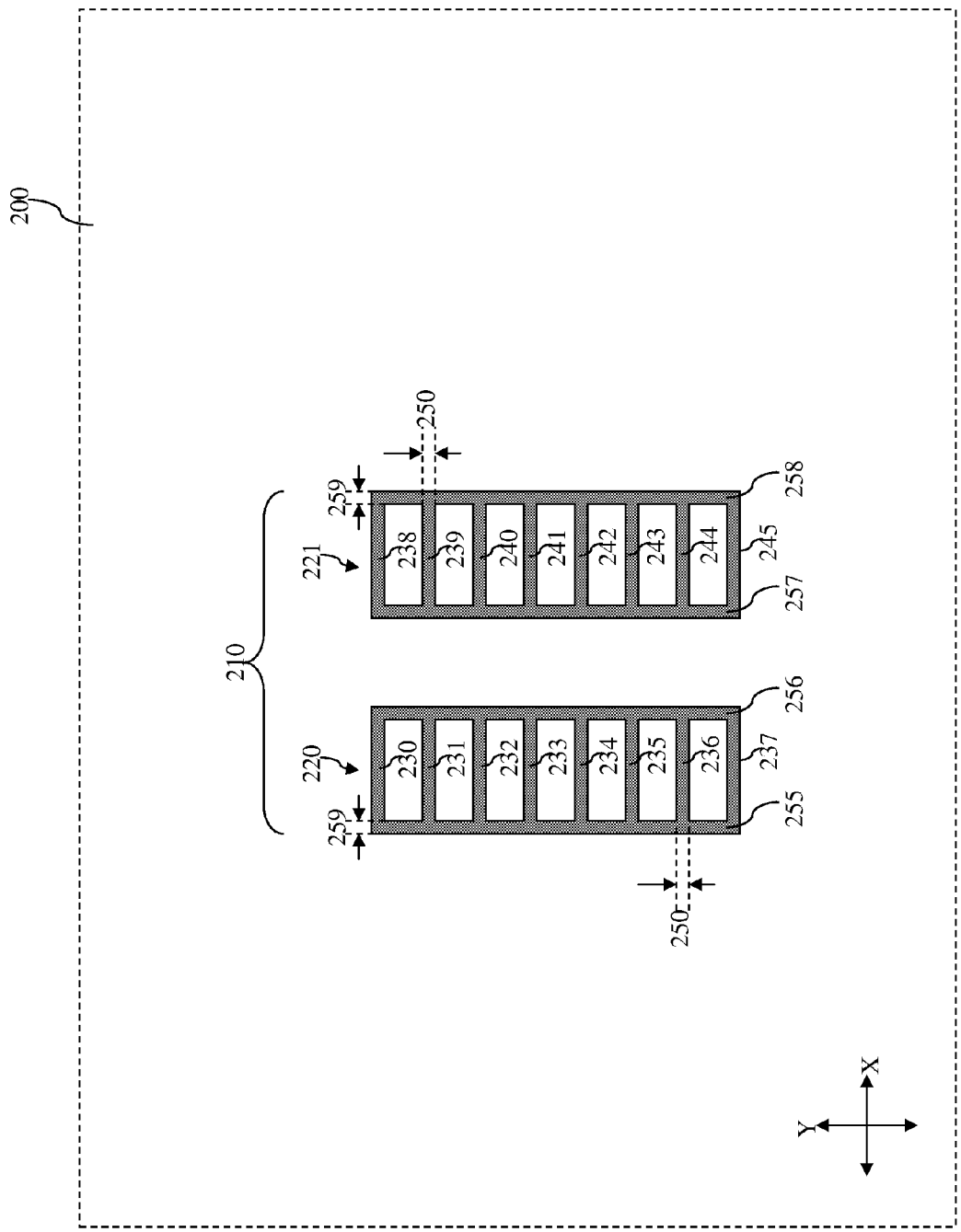
FIGS. 3-6 are diagrammatic fragmentary top level views of a portion of a wafer containing an alignment mark that corresponds to the alignment mark of FIG. 2 according to various aspects of the present disclosure.
Figure 4:
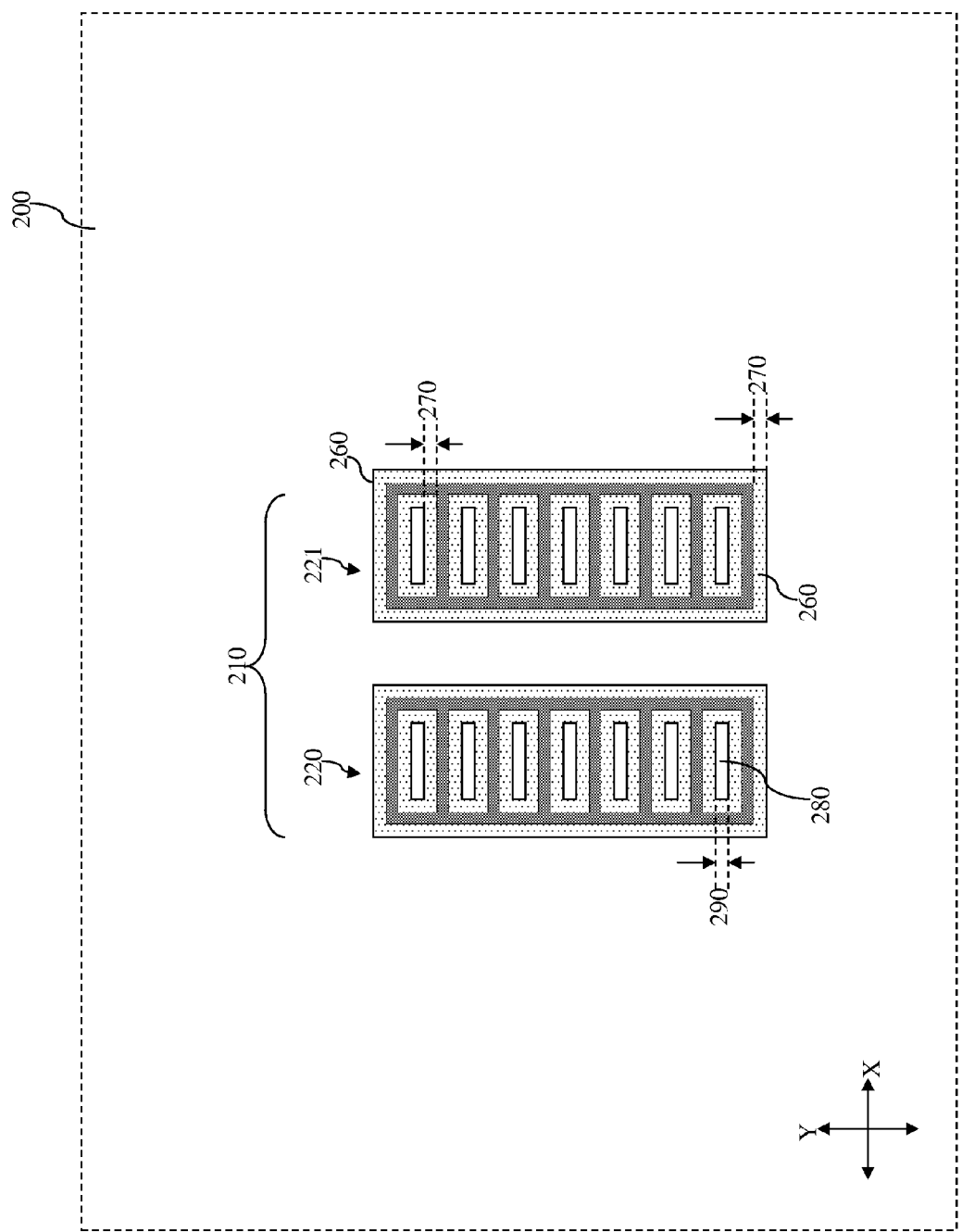
Figure 5:
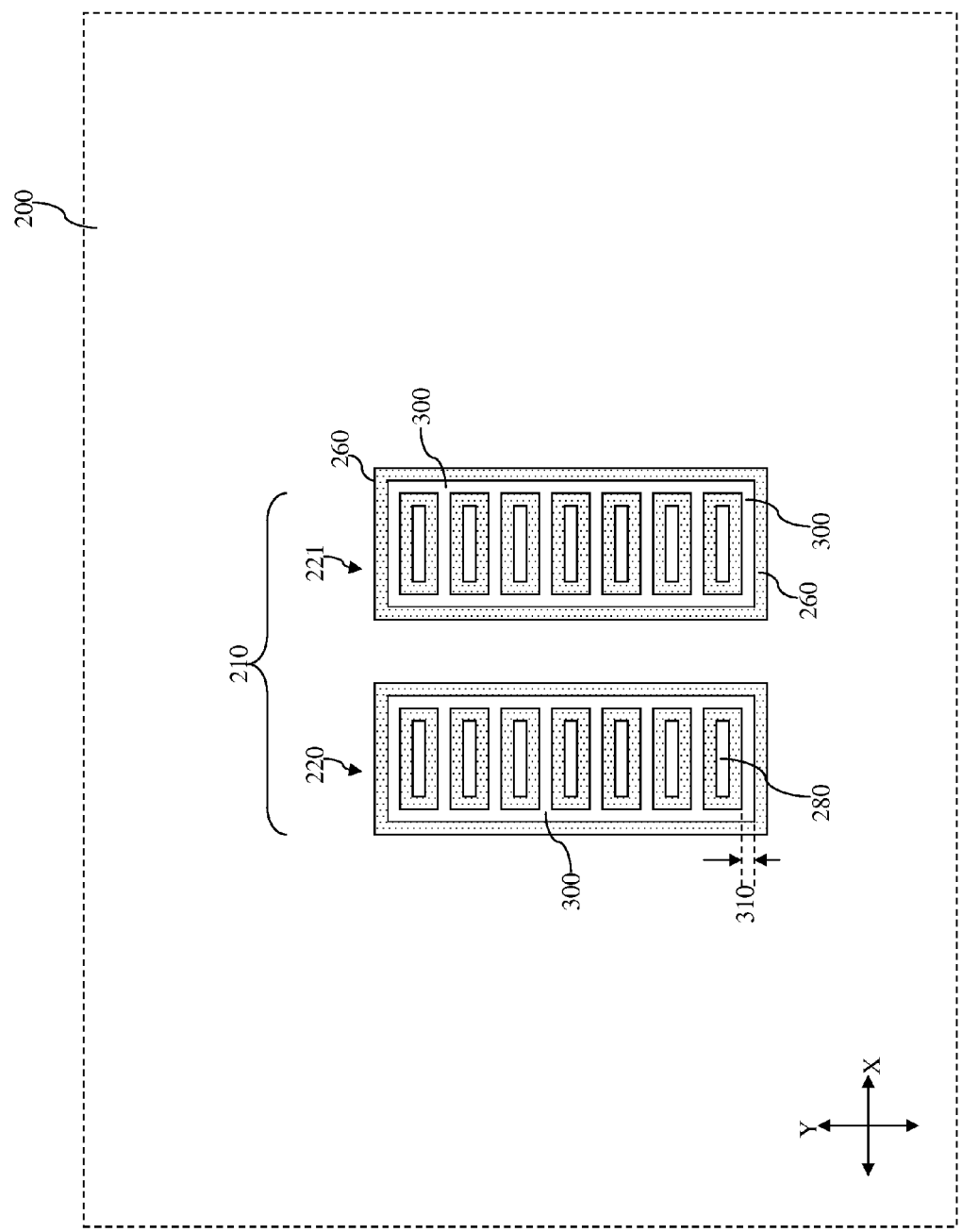

FIGS. 3-5 are diagrammatic fragmentary top level views of a portion of a semiconductor wafer 200 at various stages of fabrication. Referring now to FIG. 3, the wafer 200 is a silicon wafer. In an embodiment, the wafer 200 is doped with a P-type dopant such as boron. In another embodiment, the wafer 200 is doped with an N-type dopant such as phosphorous or arsenic. The wafer 200 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the wafer 200 could include an epitaxial layer (epi layer), may be strained for performance enhancement, and may include a silicon-on-insulator (SOI) structure.

The wafer 200 is patterned using the photomask 100 of FIG. 2. Thus, an alignment mark 210 is formed on the wafer 200. The alignment mark 210 is made of a photoresist material. In other words, the alignment mark 210 is formed by depositing a layer of photoresist on the wafer 200 through a suitable process, such as a spin coating process, and then subsequently transferring the image of the alignment mark 110 of the photomask to the wafer 200 using a suitable photolithography process. The photolithography process may include one or more exposing, developing, baking, and ashing processes.

As a result of the photolithography process, the alignment mark 210 is formed. The alignment mark 210 on the wafer 200 is a resized image of the alignment mark 110 on the photomask 100. In an embodiment, the alignment mark 210 has a substantially identical image of the alignment mark 110 but X times smaller. Thus, the alignment mark 210 includes portions 220 and 221 that each take on a substantially rectangular profile. The portions 220-221 are divided into boxes by bars 230-245 that each extend in the X-direction.

The bars 230-245 each have a dimension 250 that is measured in the Y-direction. As discussed above, the dimension 250 is small enough so that the bars 230-245 cannot be individually detected by an alignment signal in an alignment process. In other words, the bars 230-245 are sub-resolution elements, since they each have a dimension 250 that is smaller than the minimum resolution that can be detected by the alignment signal.

The alignment mark 210 also includes elongated bars (or segments) 255-258 that each extend in the Y-direction. The bars 255-258 each have a dimension 259 that is measured in the X-direction. The dimension 259 is smaller than the minimum resolution that can be detected by the alignment signal. Therefore, the bars 255-258 are also sub-resolution elements.

In an embodiment, the bars 230-237 are substantially evenly spaced apart from one another in the Y-direction, the bars 238-245 are substantially evenly spaced apart from one another in the Y-direction.

Referring now to FIG. 4, a spacer film 260 is formed over and around the alignment mark 210. The spacer film 260 is formed by a deposition process known in the art, such as chemical vapor deposition (CVD), physical vapor deposition (PVD), atomic layer deposition (ALD), combinations thereof, or another suitable technique. The spacer film 260 includes a dielectric material, such as an oxide material, a nitride material, an oxy-nitride material, or another suitable material.

In an embodiment, the spacer film 260 is formed in a manner so that a thickness of the spacer film 260 approaches, or is approximately equal to, the critical dimension of a given fabrication technology generation. The spacer film 260 is formed over other portions of the wafer 200 as a part of a spacer patterning technique, in which spacers are utilized to achieve the formation of small patterns having small pitches. For example, the reduced pitch size achieved by the spacer patterning technique may be ½ of the previous pitch size. Hence, the spacer patterning technique is referred to as a "pitch-halving" process, and is described in more detail in patent application Ser. No. 12/370,152 filed on Feb. 12, 2009, and published on Aug. 12, 2010, U.S. Publication Number 2010-0203734A1, the entire content of which is hereby incorporated by reference.

The spacer film 260 is then etched to expose the photoresist material of the alignment mark 210. At this point, the spacer film 260 becomes individual spacers that are disposed all around the various segments of the alignment mark 210, such as the bars 230-245 (shown in FIG. 3). These spacers each have a width 270 that is equal to the thickness of the spacer film 260, which approaches or is substantially equal to the critical dimension of the given semiconductor technology generation.

In the embodiment shown in FIG. 4, the spacers inside each of the portions 220-221 of the alignment mark 210 form trenches (or openings), for example, a trench 280. The shape and geometry of the alignment mark 210 (and thus the alignment mark 110 on the photomask 100, shown in FIG. 2) is designed in a manner so that each of the trenches such as the trench 280 has a dimension 290 that is measured in the Y-direction. The dimension 290 has a value that is small enough so that the trenches such as the trench 280 are considered sub-resolution patterns. In other words, the trench 280 cannot be individually recognized or discerned by an alignment signal used in an alignment process.

It is understood, however, that in alternative embodiments, the alignment mark 210 may be designed and formed in a manner so that the trenches like the trench 280 will disappear altogether. Alternatively stated, the spacers 260 may merge together in a manner so that the "boxes" of the alignment mark 210 are completely filled by the spacer material.

Referring now to FIG. 5, the photoresist material is removed using a photoresist removal process known in the art, such as an ashing or a stripping process. The spacers 260 remain after the removal of the photoresist material. At this stage of fabrication, each of the portions 220-221 of the alignment mark 210 includes a plurality of small "boxes" formed by the spacer material. In addition to the trenches (such as the trench 280) inside these boxes, the removed photoresist material in effect forms openings 300 in the portions 220-221.

The opening 300 includes a plurality of trench segments that extend in both the X-direction and the Y-direction. The trench segments of the opening 300 each have a dimension 310. The dimension 310 may be measured in the X-direction or the Y-direction. As was the case for the trench 280, the dimension 310 is small enough so that the trench segments of the opening 300 are considered sub-resolution patterns, meaning that these trench segments cannot be individually recognized or detected by an alignment signal in an alignment process. In an embodiment, the dimension 310 is substantially equal to the dimensions 250 and 259 (shown in FIG. 3).

The alignment mark 210 can be used to align a semiconductor wafer and a photomask during a photolithography process. As discussed above, an alignment mark used under existing methods may have large dimensions, and may disappear when it is formed at the same time as smaller patterns. As an example, the spacer patterning technique referenced above may be used to achieve small device geometries and pitch sizes. However, this technique will result in the disappearance of a significant portion of the alignment mark. For instance, instead of having one or more large rectangles as an intended shape, an alignment mark may have two much smaller line patterns (spacers) located at top and bottom edges of the rectangle, thereby destroying the intended shape of the alignment mark.

To address this problem, previous patterning techniques have used an additional photomask to cover up (or protect) portions of the wafer containing the alignment mark during the formation of the small patterns. However, that approach increases fabrication costs and fabrication time due to the extra photomask and the additional patterning process.

Figure 6:
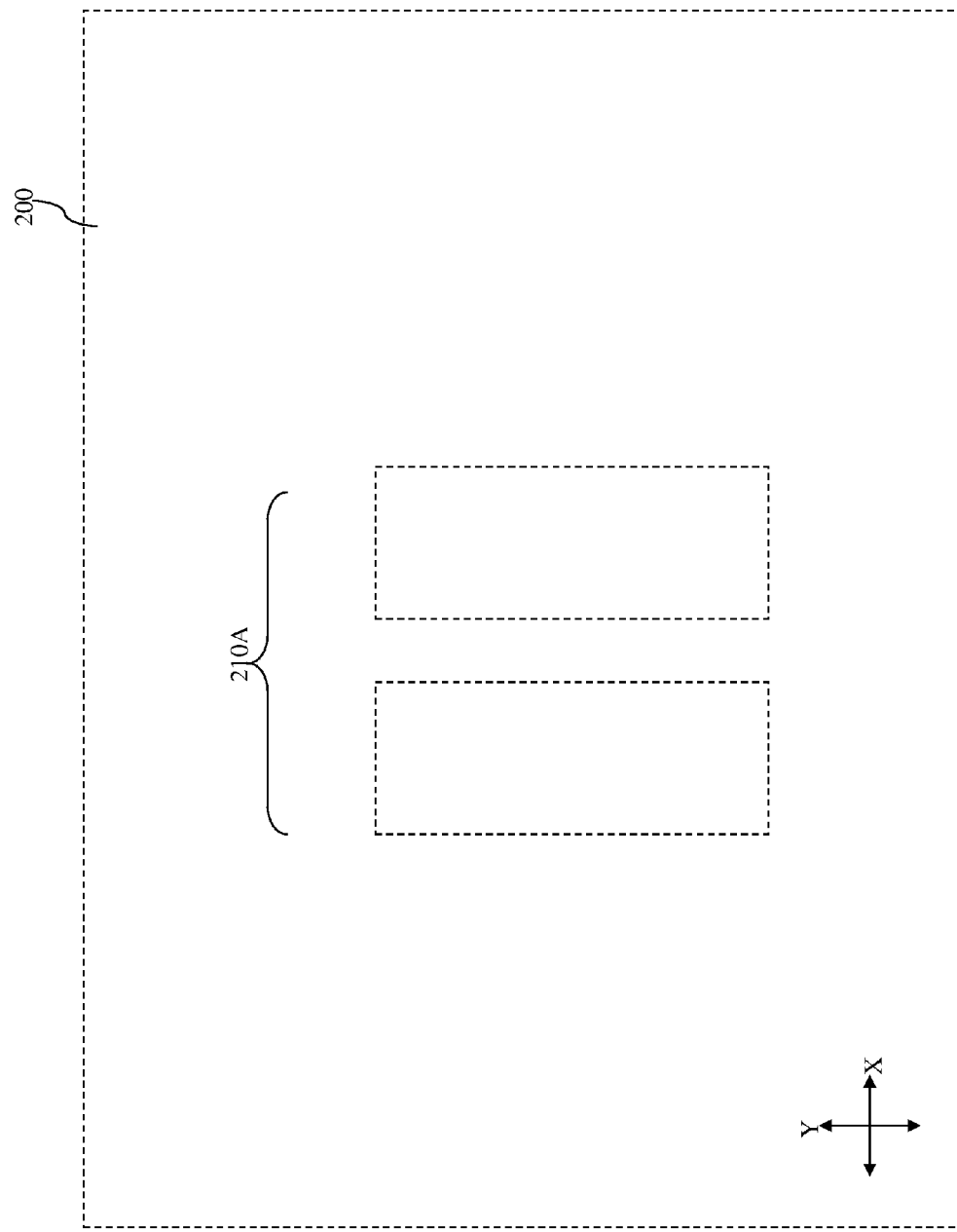

In comparison, the alignment mark 210 discussed herein offers advantages over existing alignment marks. It is understood, however, that other embodiments of the alignment mark fabricated within the spirit of the present disclosure may offer different advantages, and that no particular advantage is required for all embodiments. One advantage is that the alignment mark 210 will not disappear in a spacer patterning technique. The alignment mark 210 has a shape that resembles rectangles being segmented into much smaller portions (sub-resolution patterns). Since the trench segments of the openings 300 and the trenches such as the trench 280 are sub-resolution patterns, they will not be detected by the alignment signal in the alignment process. Thus, the opening 300 and the trenches such as the trench 280 essentially disappear when viewed by the alignment signal. The alignment signal will then "treat" or "view" the alignment mark 210 as two large rectangles having shapes defined by the outer profile of the portions 220 and 221. Refer to FIG. 6 for an alignment mark 210A that the alignment signal "thinks" it sees instead of the alignment mark 210 of FIG. 5.

Another advantage is that, since the alignment mark 210 will not disappear for the reasons discussed above, no extra photomask or additional patterning process is required (to cover up the alignment mark 210) when the spacer patterning technique is carried out. This lowers fabrication costs and reduces fabrication time.

The alignment mark 210 can be used to pattern a material layer therebelow and form an alignment mark in that material layer accordingly. Also, although the trenches illustrated in FIG. 5 are formed in a manner so that they mostly extend in the X or Y directions, in alternative embodiments, they may be formed to extend in other directions. In other words, the alignment mark 210 may be segmented in an X-direction, a Y-direction, a direction different from both the X and Y directions, or combinations thereof. As such, sub-resolution features (with respect to an alignment signal) may be created in any one of these directions.

Figure 7:
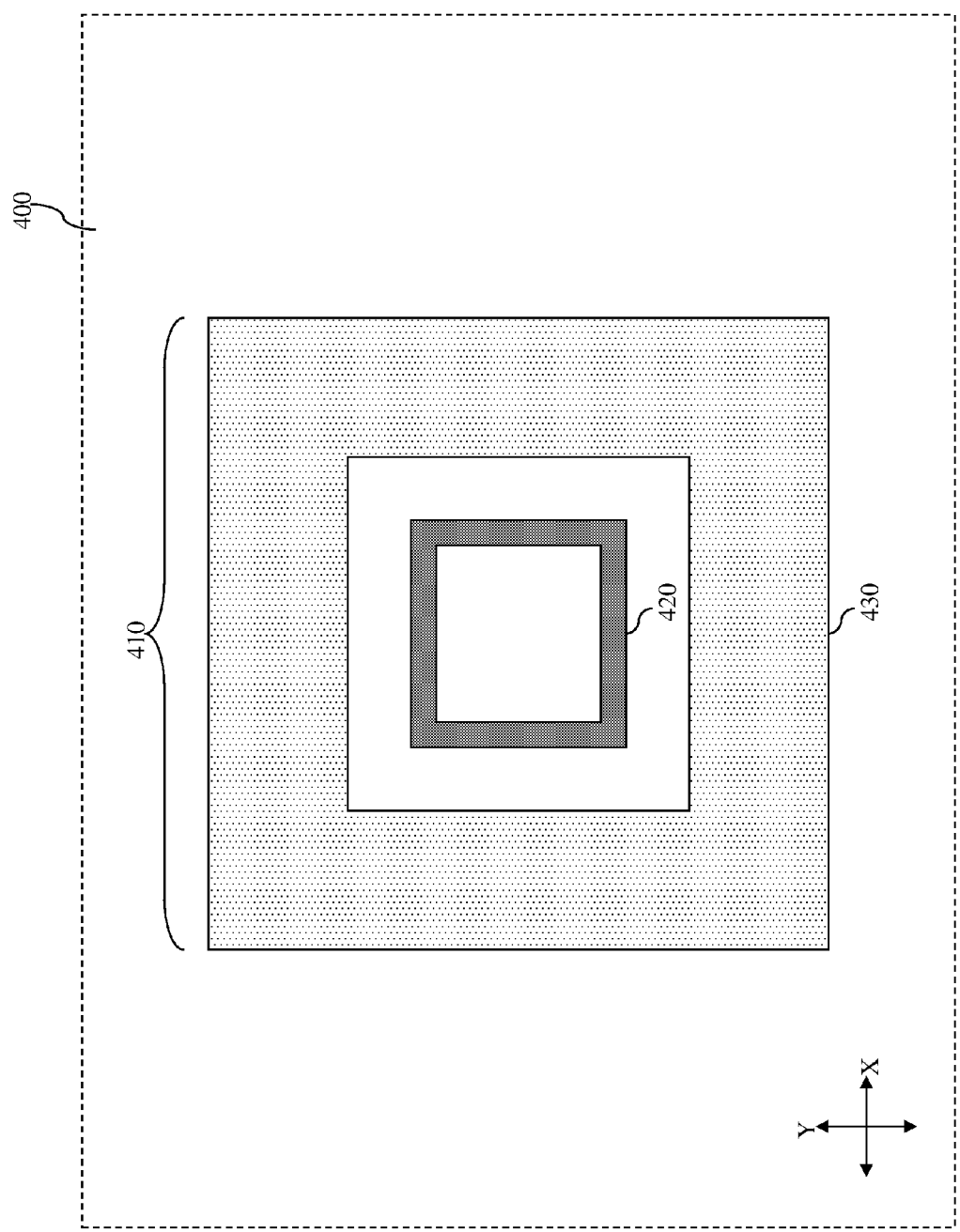
FIGS. 7-8 are diagrammatic fragmentary top level views of a portion of a wafer containing an alternative alignment mark according to various aspects of the present disclosure.

To further illustrate how an alignment mark can be segmented to eliminate the "disappearing large pattern" problem, shown in FIG. 7 is a diagrammatic fragmentary top view of an overlay mark 410 on a wafer 400. The overlay mark 410 has a "box-in-box" structure and is used for process monitor in a metrology measurement process. In more detail, the overlay mark 410 has an inner box 420 and an outer box 430. The inner box 420 and the outer box 430 may belong to different layers on a semiconductor wafer. The shape and geometry of the overlay mark 410 are the shape and geometry that a measurement signal is supposed to detect and recognize in a metrology measurement tool.

However, the overlay mark 410 (specifically the outer box 430) may have dimensions that are large enough, such that the "disappearing large pattern" problem discussed above with reference to FIGS. 2-5 may occur when the overlay mark 410 is formed using the same processes of the spacer patterning technique referenced above. When that happens, the overlay mark 410 will no longer take on the shape and geometry displayed in FIG. 7. For example, the outer box 430 may be formed to be two thin rectangular boxes, one inside the other, with an opening separating the two rectangular boxes.

Figure 8:
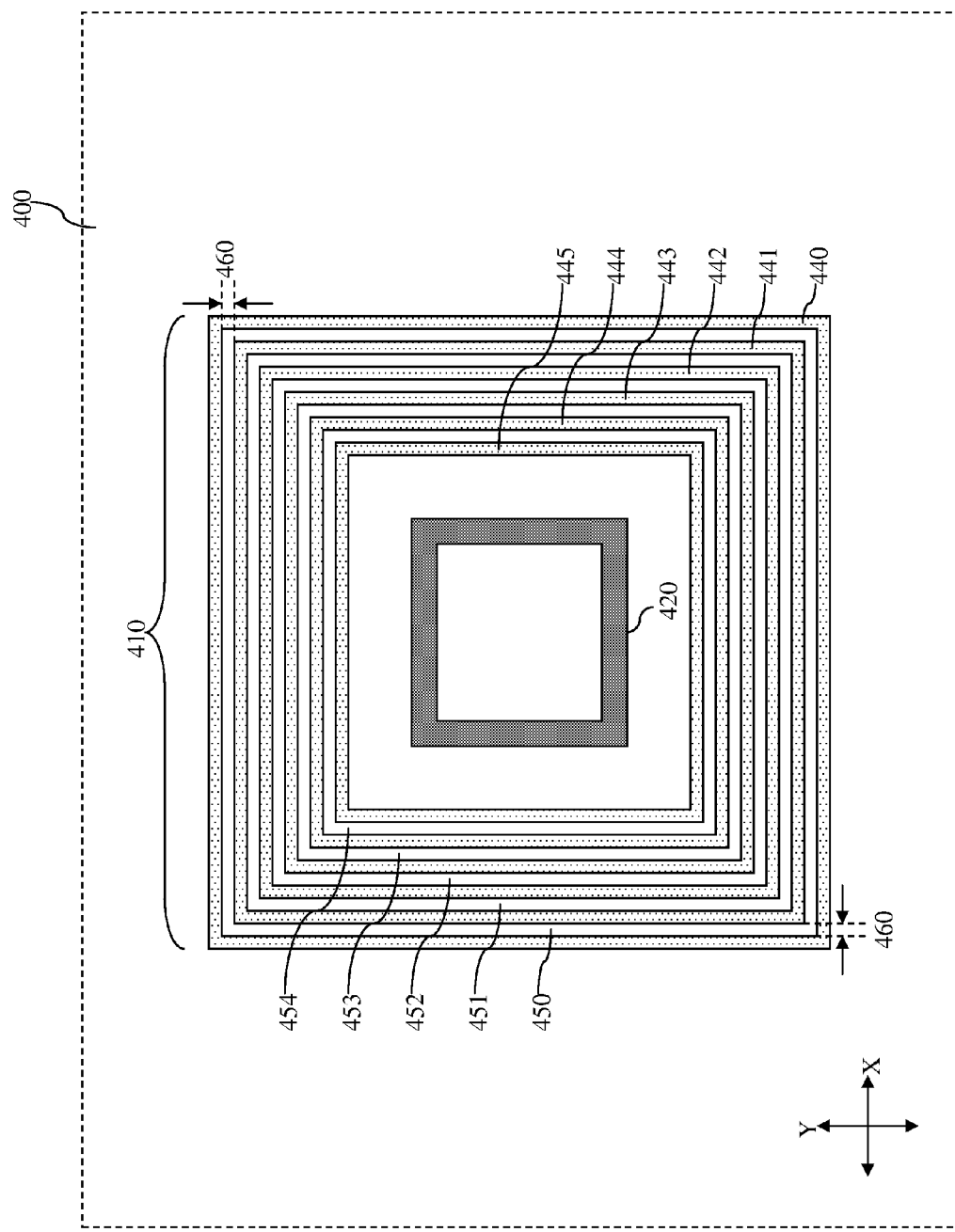

To prevent that problem from occurring, the overlay mark 410 (in particular, the outer box 430) can be segmented in a manner similar to that discussed above in association with the alignment mark 210 of FIGS. 2-5. The segmented overlay mark 410 is shown in FIG. 8.

The outer box 430 is segmented into six (or more) rectangular boxes 440-445, wherein each of the boxes 440-445 contains a spacer material. The boxes 440-445 are separated by trenches 450-454 (or openings) that each have a rectangular shape. The trenches 450-454 are formed by removing a photoresist material that occupied the trenches 450-454. In other words, the boxes 440-445 are spacers formed around the photoresist material, and the subsequent removal of the photoresist material results in the formation of the trenches 450-454. The spacer-forming process and the photoresist-removal process are the same processes used in the spacer patterning technique referenced above, which is used to pattern features elsewhere on the wafer 400 to achieve the "pitch-halving" discussed in the patent application with the Ser. No. 12/370,152.

The trenches 450-454 each have a dimension 460 in the X-direction and in the Y-direction. The value of the dimension 460 is small enough to be considered sub-resolution patterns with respect to a measurement signal of an alignment process. Thus, the trenches 450-454 will not be detected or recognized by the measurement signal. To the measurement signal, it is as if the trenches 450-454 do not exist. Consequently, the boxes 440-445 are collectively recognized by the measurement signal as the outer box 430 (shown in FIG. 7).

Therefore, the overlay mark 410 requires no additional photomask to protect it when the spacer patterning technique is carried out. The segmentation of the outer box 430 of the overlay mark 410 allows for the spacer patterning technique to be performed with respect to the overlay mark 410 without protection for the overlay mark 410. Since the overlay mark 410 is designed so that the openings 450-454 formed therein will not be recognized by the measurement signal, the "disappearing large pattern" problem is prevented.

The spacer patterning technique referenced above that is used to achieve smaller pitches between semiconductor patterns also has a "line-end" issue. In more detail, the spacer patterning technique involves forming spacers around line patterns (such as photoresist line patterns), and then using the spacers as hard masks to pattern features therebelow. However, since the spacers are formed all the way around the line patterns—meaning that each of the line patterns is surrounded by a "ring" of spacers—the spacers around the end portions of the line patterns will need to be removed, otherwise they may cause shorting between semiconductor features patterned by the adjacent spacers.

To eliminate the "line-end" problem discussed above, traditional semiconductor fabrication processes have used one or more additional photomasks and photolithography processes to "crop" off the portions of the spacers surrounding the end portions of the line patterns. This is referred to as "line-end cropping", and it will cause the "ring" of spacers to be transformed into two adjacent "lines." However, the additional photomask and photolithography process increases fabrication costs and lengthens fabrication time. Furthermore, as discussed above, traditional spacer patterning techniques may need extra photomasks and photolithography processes to prevent the "disappearing large pattern" problem.

The present disclosure involves a cheaper and more efficient method to solve the "line-end" problem without using extra masks. The present disclosure also helps eliminate the "disappearing large pattern" problem. One of the embodiments of the method of the present disclosure is discussed below and illustrated in FIGS. 9-11.

Figure 9:
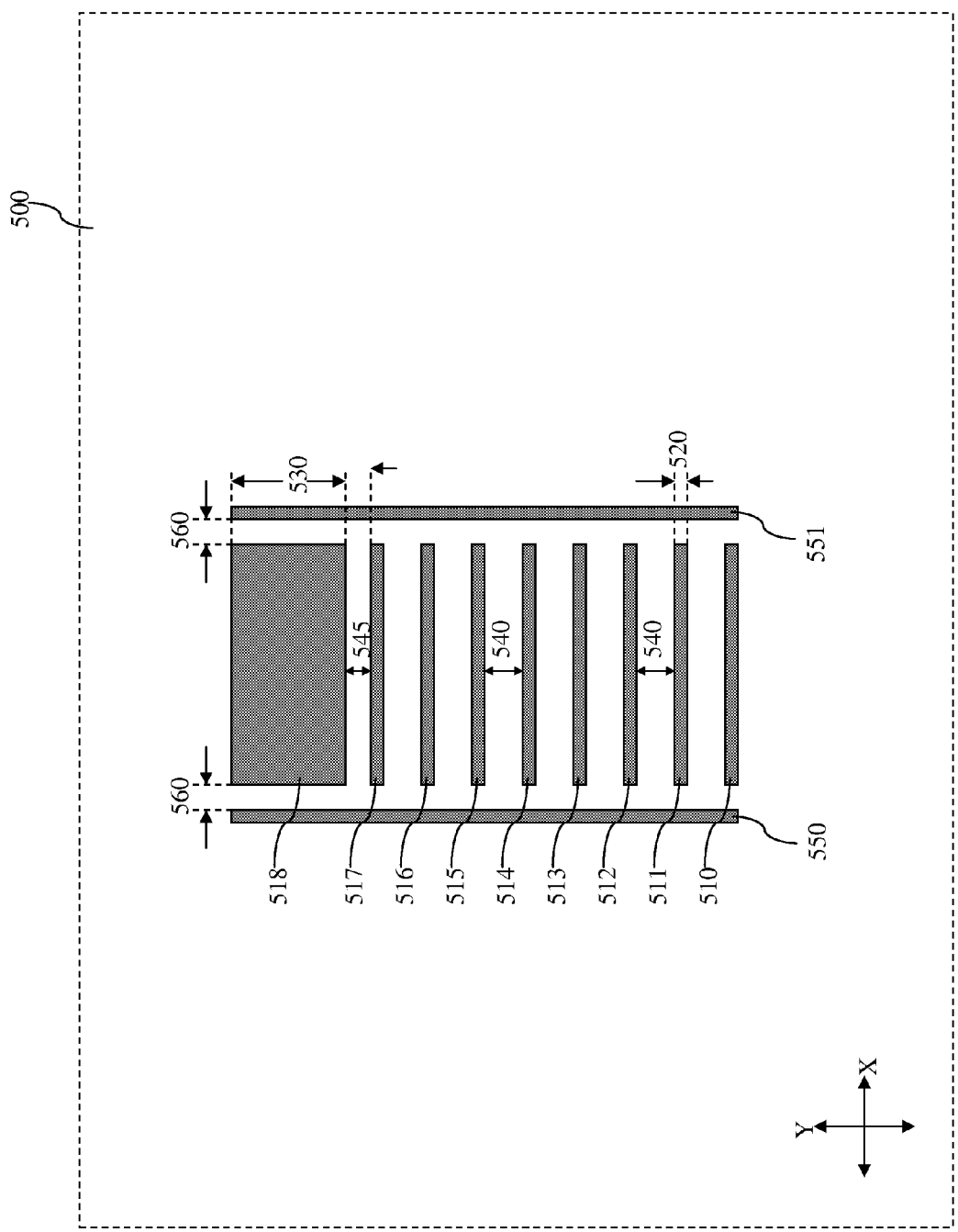
FIGS. 9-13 are diagrammatic fragmentary top level views of a portion of a wafer that is undergoing various patterning stages according to various aspects of the present disclosure.
Figure 10:
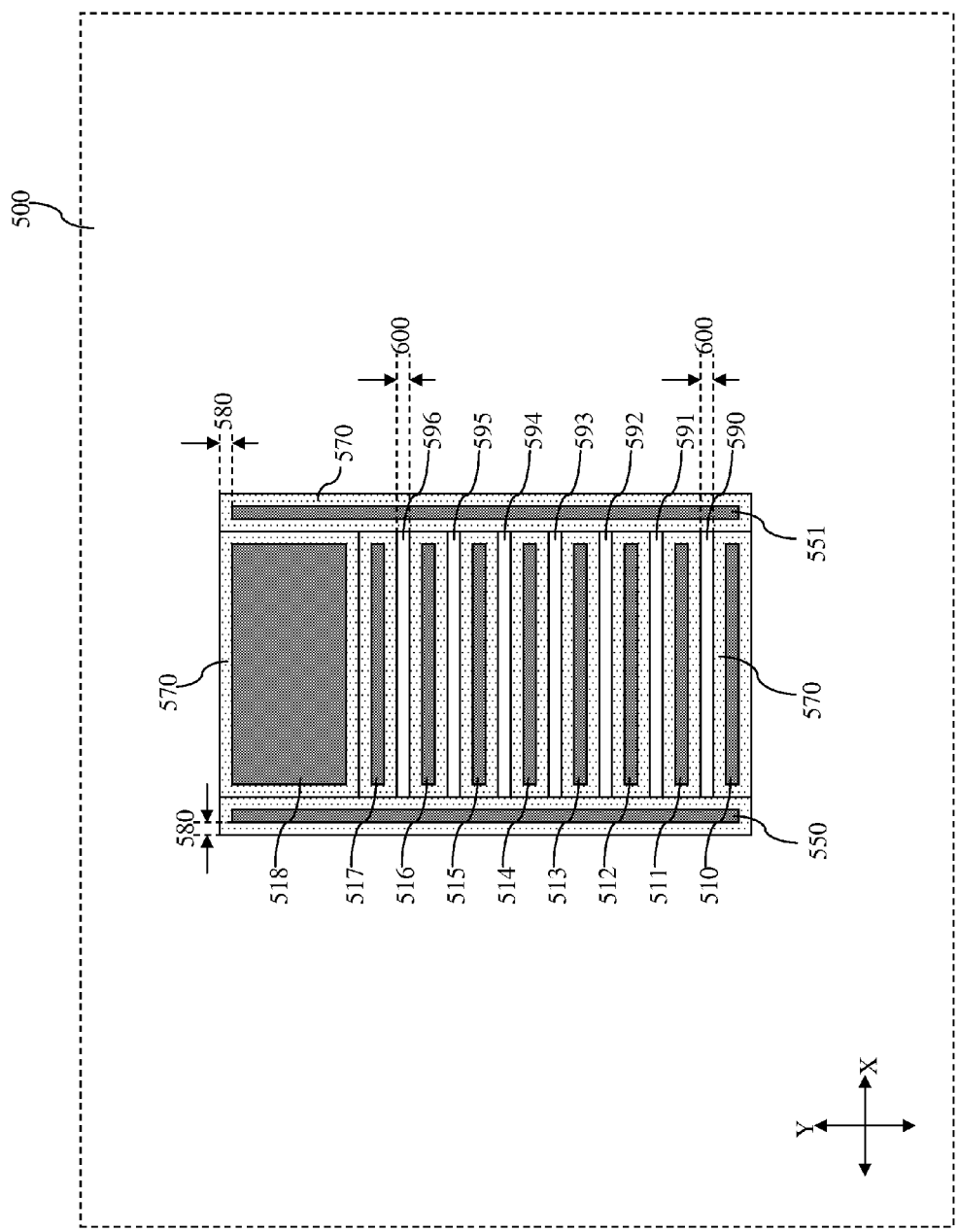
Figure 11:
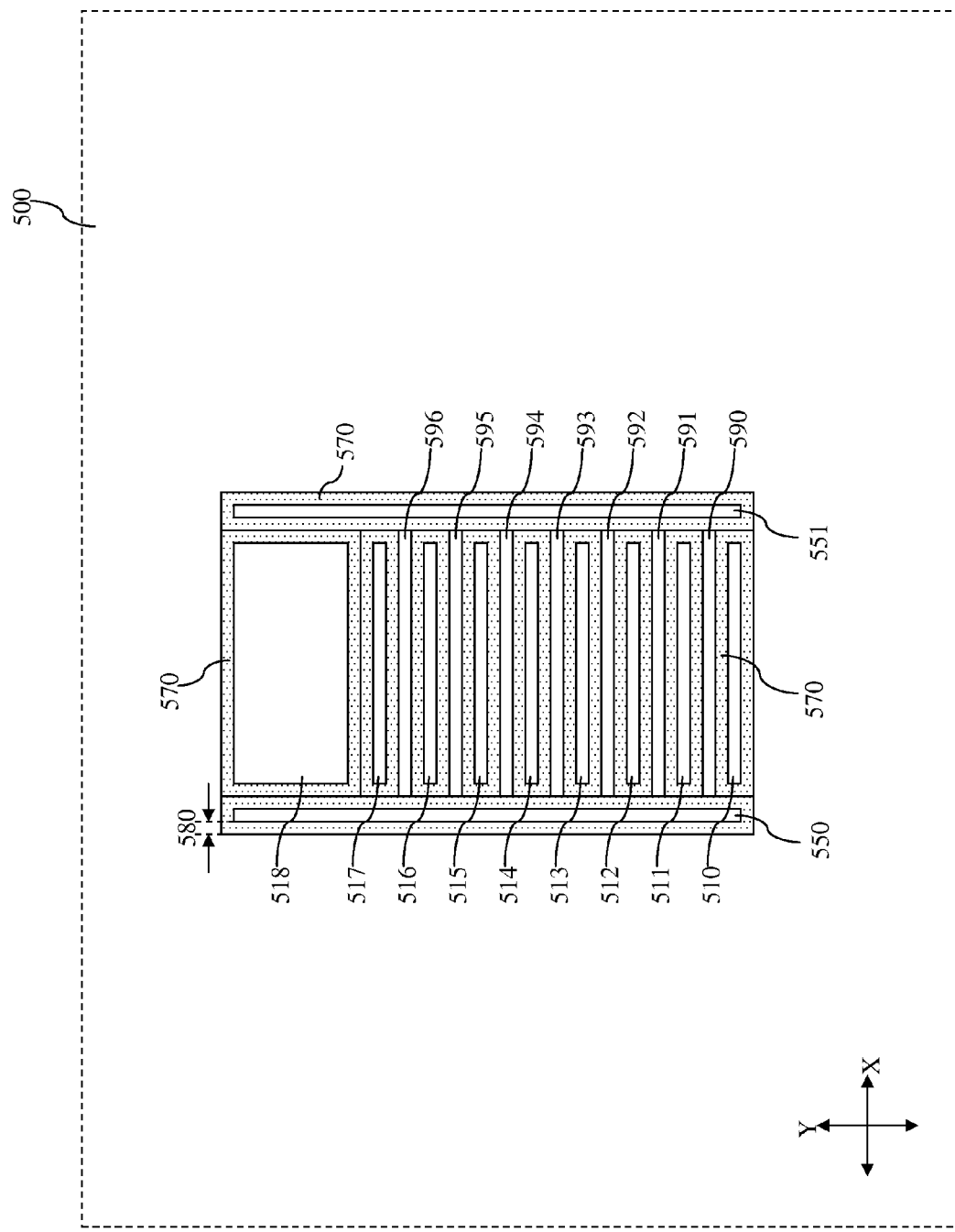

FIGS. 9-11 are diagrammatic fragmentary top level views of a portion of a semiconductor wafer 500 at various stages of patterning. Referring to FIG. 9, a plurality of patterns 510-518 are formed on the wafer 500. The patterns 510-518 each include a photoresist material in the present embodiment, but may include other materials in alternative embodiments.

As illustrated in FIG. 9, the patterns 510-517 are relatively small patterns and each have a dimension 520 that is measured in the Y-direction. In an embodiment, the dimension 520 has a value that is approximately equal to a critical dimension of a given semiconductor fabrication technology generation. The pattern 518 is a relatively large pattern and includes a dimension 530 that is measured in the Y-direction. In an embodiment, the dimension 530 is substantially greater than the dimension 520. Thus, the pattern 518 may be used to form large patterns on the wafer 500. For example, the pattern 518 may be used to form input/output (I/O) devices (or a portion thereof), or alignment marks (or a portion thereof).

In an embodiment, the patterns 510-517 are separated from one another in the Y-direction by a distance 540, and the pattern 517 and 518 are separated from each other in the Y-direction by a distance 545. In an embodiment, the distance 540 is approximately equal to the sum of: a critical dimension of a fabrication technology generation and twice the thickness of a spacer formed in the spacer patterning technique. The distance 545 is less than, or equal to, the sum of twice the thickness of a spacer formed in the spacer patterning technique.

Dummy patterns 550 and 551 are formed near the end portions (in the X-direction) of the patterns 510-518. The dummy patterns 550-551 are formed in the same fabrication process that forms the patterns 510-518 and may each include a photoresist material. The dummy patterns 550-551 are each spaced apart from the patterns 510-518 by a distance 560. In an embodiment, the distance 560 is less than twice the thickness of a spacer formed in the spacer patterning technique. The dummy patterns 550-551 help eliminate the "line-end" problem, as will be discussed in more detail below.

Referring now to FIG. 10, a spacer film 570 is formed on the wafer 500. The spacer film 570 is formed by a suitable deposition process known in the art, such as CVD, PVD, ALD, or combinations thereof. The spacer film 260 includes a dielectric material, such as an oxide material, a nitride material, an oxy-nitride material, or another suitable material. The spacer film 570 is then etched to form spacers 570. The spacers 570 surround each of the patterns 510-518. The spacers 570 are formed as a part of the spacer patterning technique referenced above. The spacers 570 each include a spacer thickness 580 that approaches, or is approximately equal to, the critical dimension of a given fabrication technology generation.

As discussed above with reference to FIG. 9, the distance 560 separates each of the dummy patterns 550-551 from the patterns 510-518. The distance 560 is less than twice the spacer thickness 580. As a result, the spacers 570 between the dummy patterns 550-551 and the patterns 510-518 will merge into each other, leaving no gaps therebetween. Also, since the distance 545 (shown in FIG. 9) between the dummy pattern 518 and the pattern 517 is less than twice the spacer thickness 580, the spacers 570 between the dummy pattern 518 and the pattern 517 will also merge together.

Meanwhile, recall that the distance 540 (shown in FIG. 9) that separates the patterns 510-517 from one another is approximately equal to the sum of: a critical dimension of a fabrication technology generation and twice the spacer thickness 580. Therefore, the spacers 570 formed between the patterns 510-517 will not merge together, and instead will define boundaries of trenches 590-596, along with the spacers 570 formed around the dummy patterns 550-551. In other words, the spacers 570 formed between the patterns 510-517 define the edges of the trenches 590-596 in the X-direction, and a portion of the spacers 570 formed around the dummy patterns 550-551 define the edges of the trenches 590-596 in the Y-direction. These trenches 590-596 each have a dimension 600 that is measured in the Y-direction. The dimension 600 is approximately equal to the critical dimension of a fabrication technology generation.

Referring now to FIG. 11, the photoresist material of the patterns 510-517 as well as the photoresist material of the dummy patterns 550-551 are removed in a suitable process, such as an ashing process or a stripping process. The removal of the photoresist material transforms the patterns 510-517 and the dummy patterns 550-551 into trenches (openings) 510-517 and 550-551.

At this stage of fabrication, the trenches 510-517 and the trenches 590-596 essentially have been "pitch-halved" compared to the patterns 510-517 in FIG. 9. The trenches 510-517 and 590-596 can be used to pattern semiconductor elements therebelow, and therefore may be referred to as device patterns. For example, if a trench pattern (for example, a metal line) is desired, then the trenches 510-517 and 590-596 can be used to form these trench patterns directly to the material layer therebelow.

If a line pattern (for example, a gate line) is desired, then a deposition process can be used to fill the trenches 510-517 and 590-596 with a material, for example with a hard mask material. The hard mask material is different from the spacer material of the spacers 570 (that define the boundaries of the trenches 510-517 and 590-596). For example, the hard mask material and the spacers 570 may have a different etching selectivity. Thereafter, the spacers 570 can be removed, and then the hard mask material filling the openings 510-517 and 590-596 can then be used as hard mask patterns to form the desired line patterns in the material layer therebelow.

Therefore, the embodiment discussed above in FIGS. 9-11 accomplishes the pitch-halving objective of the spacer patterning technique without needing additional masks to perform "line-end cropping." The half-pitched patterns were the spacers (after "line-end cropping" is performed) according to the spacer patterning technique. In comparison, the embodiment disclosed herein uses the trenches 510-517 and 590-596 as the half-pitched patterns. Since the trenches 510-517 and 590-596 are already completely separated from one another, there is no need to do "line-end cropping" (there is no potential shorting between the features to be patterned by the trenches 510-517 and 590-596). In addition, the dimensions of the trenches 510-517 and 590-596 are approximately equal to the critical dimension. Therefore, very small features can be patterned by the trenches 510-517 and 590-596 in addition to achieving the pitch-halving objective.

From the above discussions, it can be seen that one of the advantages offered by the embodiment discussed with reference to FIGS. 9-11 is a more efficient and cheaper patterning process. The trenches 510-517 and 590-596 can be used to pattern the wafer and require no "line-end cropping", and yet they are able to achieve the same objectives of the spacer patterning techniques discussed previously.

Another advantage offered by the embodiment discussed with reference to FIGS. 9-11 is that it eliminates the "disappearing large pattern" problem. As illustrated in FIG. 11, the large pattern 518 may become a large trench 518, but it still retains its original shape and geometry after the smaller trenches 510-517 are formed. A deposition process may be utilized to fill the large trench 518 so as to create a large pattern after the spacers 570 are removed. In other words, the pattern 518 may be restored through a "reverse process". As discussed previously, this large pattern 518 can be used to pattern an alignment mark, an I/O device, or portions thereof.

Figure 12:
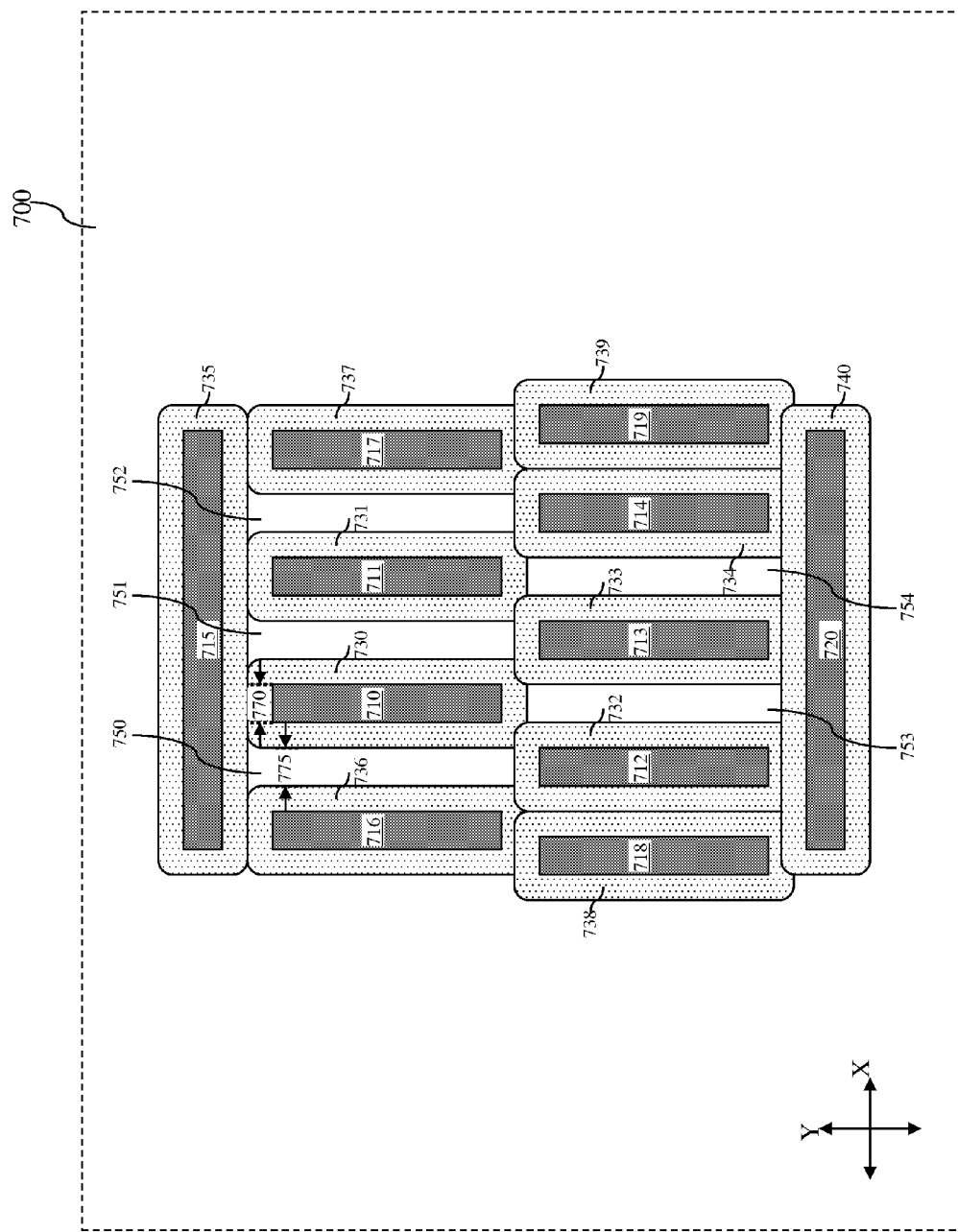
Figure 13:
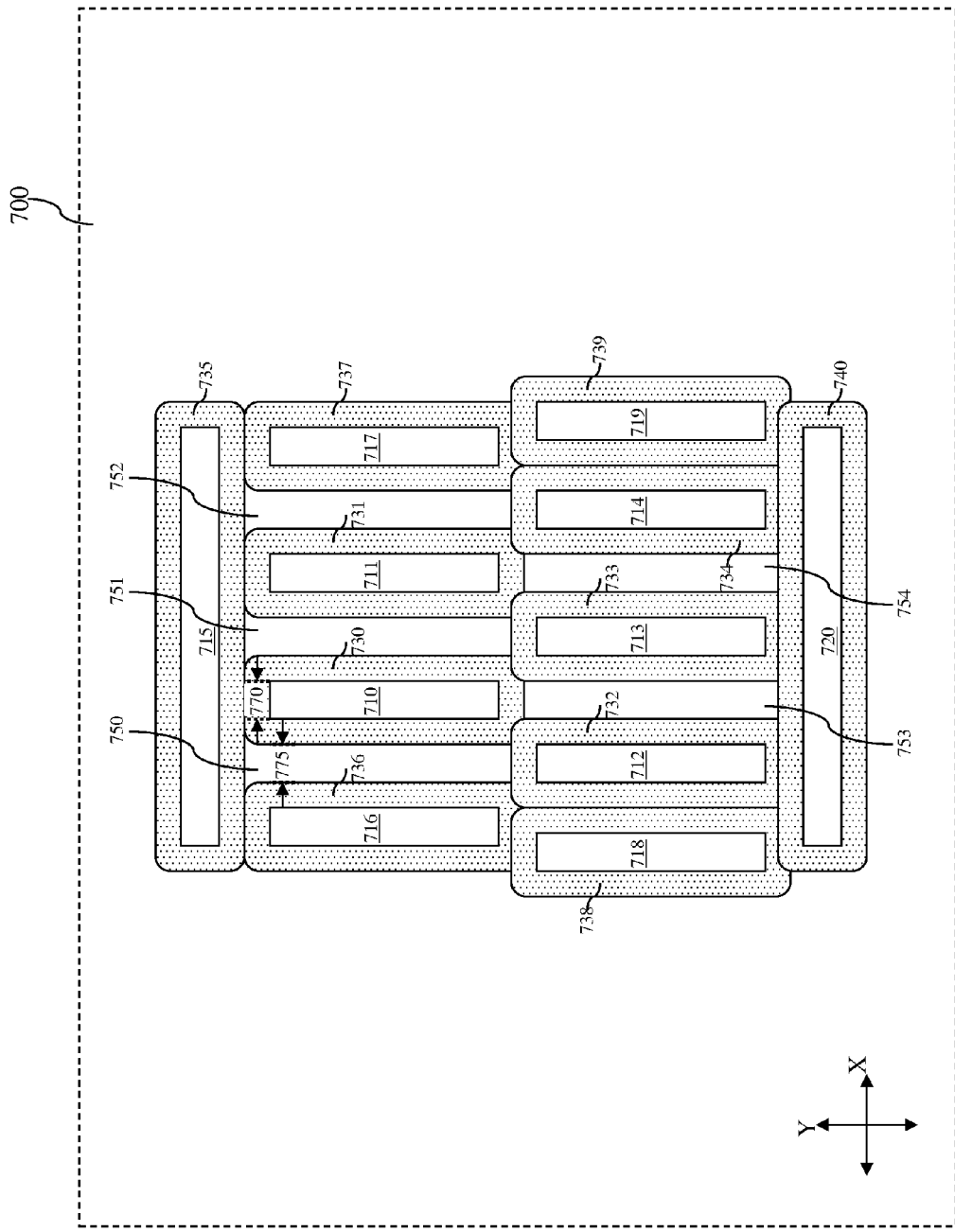

FIGS. 12-13 illustrate another example showing how dummy patterns can be used to resolve the "line-end" cropping issue. FIGS. 12-13 are diagrammatic fragmentary top level views of a portion of a semiconductor wafer 700 at various stages of patterning. Referring to FIG. 12, a plurality of patterns 710-720 are formed on the wafer 700. The patterns 710-720 each include a photoresist material in the present embodiment, but may include other materials in alternative embodiments.

The patterns 710-714 are desired patterns, which may also be referred to as device patterns. For example, the patterns 710-714 may be used later to form lines (such as gate lines) or trenches (such as trenches for metal interconnect lines). The patterns 715-720 are dummy patterns and are used to help eliminate the "line-end cropping" issue. Spacers 730-740 are formed around the patterns 710-720, respectively.

The placement/location of the dummy patterns 715-720 are chosen in a manner such that trenches 750-754 are defined by the spacers 730-740. For example, the spacers defining the boundaries of the trenches 750-754 are merging into the adjacent spacers, or at least coming into contact with the adjacent spacers. This ensures that no undesired holes or openings are inadvertently formed. In more detail, the trench 750 is formed by the spacers 735 (defining an upper boundary), 732 (defining a lower boundary), 736 (defining a left boundary), and 730 (defining a right boundary). Similarly, the trench 751 is formed by the spacers 735, 733, 730, and 731; the trench 752 is formed by the spacers 735, 734, 731, and 737; the trench 753 is formed by the spacers 730, 740, 732, and 733; the trench 754 is formed by the spacers 731, 740, 733, and 734. The design rules governing the placement of the dummy patterns will be discussed in more detail later with reference to FIGS. 14A-14E.

Referring back to FIG. 12, the patterns 710-715 each have a lateral dimension 770, and the trenches 750-754 each have a lateral dimension 775. The lateral dimensions 770 and 775 are measured in the X-direction and may each approach a critical dimension associated with a semiconductor fabrication technology generation. In an embodiment, the lateral dimensions 770 and 775 are substantially equal, and the trenches 750-754 are respectively aligned along the Y-direction with the patterns 712, 710, 713, 711, and 714.

Referring now to FIG. 13, the patterns 710-720 are removed. Therefore, the patterns 710-720 become trenches 710-720. The trenches 710-714 are desired trenches, which may thereafter be used to form trench patterns in a layer therebelow. The trenches 715-720 are dummy trenches, which may or may not be used to pattern anything thereafter.

It can be seen now that the trenches 750 and 712 appear as if they were a single trench that has been cut in the middle to become two trenches. The same can be said for the trenches 710 and 753, the trenches 751 and 713, the trenches 711 and 754, and the trenches 752 and 714. In traditional processes, an extra mask may be required to cut the line/trench patterns into two (or more) separate line/trench patterns as well. This extra mask may be the same mask as the mask used to carry out the "line-end cropping."

In comparison, the dummy patterns 715-720 here are formed so that their spacers 735-740 touch or merge into the spacers 730-734 of the patterns 710-714. Thus, the trenches 750-754 are "constrained" by these spacers 730-740. The "line-end" problem is obviated in this fashion. In addition, no extra mask is required to cut these trenches. This means that only a single mask is needed to pattern the wafer 700 in a desired manner using only a single patterning process.

FIGS. 14A-14E help illustrate some design rules regarding the formation of the dummy patterns and the spacers discussed above with reference to FIGS. 9-13. Referring to FIG. 14A, top level views of example polygons 800-802 are shown. The polygons 800-802 are the layout patterns used to form the desired line/trench patterns. It is understood that a layout may contain a plurality of polygons that are similar to the polygons 800-802, though they may be different in shape. One of the design rules is that for the spacers around the polygons 800-802 to merge, the spacing between adjacent polygons should be less than or equal to twice the spacer sidewall thickness. In FIG. 14A, the spacer sidewall thickness is designated with reference numeral 810, and the spacing between adjacent polygons is designated with reference numeral 815. This design rule ensures that no undesired empty openings/holes will be formed by the spacers, and that the spacers will form the desired trench openings instead.

Referring to FIG. 14B, top level views of example polygons 820-824 are shown. The spacers (not illustrated) that will be formed around the polygons 820-824 will result in the formation of example trenches 830 and 831, whose boundaries are shown as broken lines in FIG. 14B. Some of the design rules illustrated by FIG. 14B include:

The smaller polygons (such as the polygons 820-821) have a dimension that is substantially equal to a critical dimension target associated with a semiconductor fabrication technology generation. This dimension is designated with reference numeral 840 in FIG. 14B. In an embodiment, the dimension 840 may be in a range from about 20 nm to about 40 nm.

The spacer sidewall thickness is also substantially equal to the critical dimension target associated with the semiconductor fabrication technology generation. In other words, the spacer sidewall thickness may be equal to the dimension 840 of the polygons. The spacer sidewall thickness is designated with reference numeral 841 in FIG. 14B.

A pitch between adjacent polygons is less or equal to about four times the spacer sidewall thickness 841 or the dimension 840 of the polygons. The pitch is designated with reference numeral 842 in FIG. 14B. In an embodiment, the pitch 842 is in a range from about 80 nm to about 160 nm.

As FIG. 14B illustrates, the trenches 830-831 is surrounded by extensions of polygons 820-824. The extension may be in a range from about 20 nm to about 40 nm. This is a different way of saying that the spacer sidewall thickness is in a range from about 20 nm to about 40 nm.

FIG. 14C illustrates a portion of a proper layout that meets the design rules discussed above. As FIG. 14C shows, a trench 850 is fully surrounded by spacers 855, leaving no undesired holes or openings.

FIGS. 14D-14E each illustrate a portion of an improper layout that does not meet the design rules discussed above. As FIG. 14D shows, the spacers 860 form a trench 865, but only a smaller trench 870 is desired. In other words, the trench 865 encompasses and is bigger than the desired trench 870. As a result, an undesired opening/hole is created by the improper layout shown in FIG. 14D.

Referring to FIG. 14E, the spacers 880 form a trench 885, when no trench is supposed to be formed. Thus, the entire trench 885 is an undesired hole/opening. The improper layouts shown in FIGS. 14D-14E violate the design rules and may cause problems in fabrication, and therefore should be avoided.

It is understood that the embodiments illustrated in FIGS. 2-13 and discussed above are merely examples of the concept contained within the present disclosure. Other embodiments may be implemented that carry out the trench forming process differently. For example, in alternative embodiments, additional dummy patterns or differently shaped dummy patterns may be used to help define the boundaries of the trenches. Also, the technique to eliminate the "disappearing large pattern" problem discussed above with reference to FIGS. 2-8 may be implemented and carried out along with the embodiment illustrated in FIGS. 9-13.

One of the broader forms of the present disclosure involves an alignment mark. The alignment mark includes a plurality of sub-resolution elements. The sub-resolution elements each have a dimension. The dimension is a function of a minimum resolution that can be detected by an alignment signal used in an alignment process.

Another of the broader forms of the present disclosure involves a semiconductor device. The semiconductor device includes: a first pattern formed on a semiconductor wafer. The first pattern extends in a first direction. The semiconductor device includes a second pattern formed on the wafer. The second pattern extends in the first direction and is separated from the first pattern by a first distance measured in a second direction perpendicular to the first direction. The semiconductor device includes a third pattern formed on the wafer. The third pattern is separated from the first pattern by a second distance measured in the first direction. The third pattern is separated from the second pattern by a third distance measured in the first direction. The first distance is approximately equal to the third distance. The second distance is less than twice the first distance.

Still another of the broader forms of the present disclosure involves a method. The method includes forming a first pattern on a wafer. The first pattern extends in a first direction. The method includes forming a second pattern on the wafer. The second pattern extends in the first direction and is separated from the first pattern by a first distance measured in a second direction perpendicular to the first direction. The method includes forming a third pattern on the wafer. The third pattern is separated from the first pattern by a second distance measured in the first direction. The third pattern is separated from the second pattern by a third distance measured in the first direction. The first distance is approximately equal to the third distance; and the second distance is less than twice the first distance.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An alignment mark, comprising:
a plurality of sub-resolution elements formed on a wafer;
wherein the sub-resolution elements each have a dimension that is smaller than a minimum resolution that can be detected by an alignment signal used in an alignment process, and
wherein the plurality of sub-resolution elements include a first sub-resolution element defined by a first spacer and a second sub-resolution element defined by a second spacer, wherein the first spacer is at least partially surrounded by the second spacer and the first spacer physically contacts the second spacer, wherein the first sub-resolution element is a first trench extending from a first sidewall of the first spacer to an opposing second sidewall of the first spacer and the second sub-resolution element is a second trench extending from a third sidewall of the second spacer to an opposing fourth sidewall of the second spacer.

2. The alignment mark of claim 1, wherein the first spacer is formed of a spacer film, and
wherein a thickness of the spacer film is approximately equal to a minimum critical dimension for a photolithography technology generation.

3. The alignment mark of claim 1, wherein:
the sub-resolution elements include a first subset of the sub-resolution elements and a second subset of the sub-resolution elements;
the sub-resolution elements in the first subset each extend substantially in a first direction and each have a first dimension measured in a second direction that is perpendicular to the first direction;

the sub-resolution elements in the second subset each extend substantially in the second direction and each have a second dimension measured in the first direction; and the first dimension and the second dimension are each less than the minimum resolution that can be detected by the alignment signal.

4. The alignment mark of claim 1, wherein at least a portion of the sub-resolution elements are substantially evenly spaced apart from one another.

5. The alignment mark of claim 1, wherein the dimension of each of the sub-resolution elements is approximately equal to a minimum critical dimension for a photolithography technology generation.

6. An alignment mark comprising:
a first spacer formed on a wafer and defining a first sub-resolution element, wherein the first sub-resolution element is a first trench defined by the first spacer;
a second spacer formed on the wafer and defining a second sub-resolution element, wherein the second sub-resolution element is a second trench defined by the second spacer; and
a third spacer formed on the wafer and defining a third sub-resolution element, wherein the third sub-resolution element is a third trench defined by the third spacer;
wherein the first, second, and third sub-resolution elements each have a dimension that is smaller than a minimum resolution that can be detected by an alignment signal used in an alignment process, and
wherein the first and second spacers are at least partially surrounded by the third spacer, wherein one of the first and second spacers physically contacts the third spacer.

7. The alignment mark of claim 6, wherein the first sub-resolution element and the second sub-resolution element are substantially the same size,
wherein the first trench extends from a first sidewall of the first spacer to an opposing second sidewall of the first spacer, and
wherein the second trench extends from a third sidewall of the second spacer to an opposing fourth sidewall of the second spacer.

8. The alignment mark of claim 6, wherein the first, second, and third spacers are formed of a spacer film.

9. The alignment mark of claim 6, wherein the first, second, and third sub-resolution elements each include an opening spanning the entire length of the first, second, and third trenches, respectively.

10. The alignment mark of claim 6, wherein the first spacer has a width extending along a first axis and a thickness extending along a second axis that is substantially perpendicular to the first axis, wherein the width is substantially equal to the thickness.

11. The alignment mark of claim 6, wherein the first spacer has a first width extending along a first axis and a first thickness extending along a second axis,
wherein the second spacer has a second width extending along the first axis and a second thickness extending along the second axis,
wherein the third spacer has a third width extending along the first axis and a third thickness extending along the second axis, and
wherein the first, second, and third widths are substantially equal and the first, second, and third thicknesses are substantially equal.

12. The alignment mark of claim 6, wherein the first spacer is at least partially surrounded by the second spacer such that the second trench extends from a sidewall of the second spacer to a sidewall of the first spacer.

13. The alignment mark of claim 6, further comprising a fourth spacer formed on the wafer and defining the third sub-resolution element, wherein the third trench defined by the third and fourth spacers extends from a sidewall of the third spacer to an opposing sidewall of the fourth spacer.

14. The alignment mark of claim 12, wherein the first and second spacers physically contact the third spacer, and
wherein the third trench extends from a sidewall of the third spacer to a sidewall of the second spacer.

15. The alignment mark of claim 13, wherein the fourth spacer physically contacts one of the first and second spacers.

16. An alignment mark comprising:
a first spacer formed on a wafer and defining a first sub-resolution element, wherein the first sub-resolution element is a first trench extending from a first sidewall of the first spacer to an opposing second sidewall of the first spacer; and
a second spacer formed on the wafer and defining a second sub-resolution element, wherein the second sub-resolution element is a second trench extending from a third sidewall of the second spacer to an opposing fourth sidewall of the second spacer, the first spacer physically contacting the second spacer,
wherein the first and second sub-resolution elements each have a dimension that is smaller than a minimum resolution that can be detected by an alignment signal used in an alignment process.

17. The alignment mark of claim 16, further comprising a third spacer formed on the wafer and defining a third sub-resolution element, the third spacer physically contacting one of the first and second spacers, the third sub-resolution element being smaller than the minimum resolution that can be detected by the alignment signal used in the alignment process.

18. The alignment mark of claim 17, wherein the third spacer formed on the wafer and defining the third sub-resolution element physically contacts the first and second spacers.

19. The alignment mark of claim 17, wherein the first, second, and third sub-resolution elements are different.

20. The alignment mark of claim 17, wherein the first and second sub-resolution elements are substantially the same and the third sub-resolution element is different than the first and second sub-resolution elements.

* * * * *